US008250498B2

(12) United States Patent
Huang et al.

(10) Patent No.: US 8,250,498 B2
(45) Date of Patent: Aug. 21, 2012

(54) METHOD AND APPARATUS FOR CALIBRATING A PHOTOLITHOGRAPHY PROCESS MODEL BY USING A PROCESS WINDOW PARAMETER

(75) Inventors: JenSheng Huang, San Jose, CA (US); Xin Zheng, Sunnyvale, CA (US); Kyo-Il Koo, Seoul (KR)

(73) Assignee: Synopsys, Inc., Mountain View, CA (US)

(*) Notice: Subject to any disclaimer, the term of this patent is extended or adjusted under 35 U.S.C. 154(b) by 272 days.

(21) Appl. No.: 12/695,530

(22) Filed: Jan. 28, 2010

(65) Prior Publication Data

US 2011/0185324 A1    Jul. 28, 2011

(51) Int. Cl.
*G06F 17/50* (2006.01)
(52) U.S. Cl. ............................. 716/55; 716/54; 716/56
(58) Field of Classification Search .................. 716/54, 716/55, 56
See application file for complete search history.

(56) References Cited

U.S. PATENT DOCUMENTS

| | | | |
|---|---|---|---|
| 2003/0134205 A1* | 7/2003 | Yu | 430/5 |
| 2004/0139418 A1* | 7/2004 | Shi et al. | 716/19 |
| 2006/0075377 A1* | 4/2006 | Broeke et al. | 716/19 |
| 2008/0309902 A1* | 12/2008 | Rosenbluth | 355/53 |
| 2009/0146259 A1* | 6/2009 | Jessen et al. | 257/618 |
| 2009/0157577 A1* | 6/2009 | Chauhan et al. | 706/16 |
| 2010/0119961 A1* | 5/2010 | Ye et al. | 430/30 |
| 2010/0171036 A1* | 7/2010 | Abdo | 250/307 |

* cited by examiner

*Primary Examiner* — Stacy Whitmore
*Assistant Examiner* — Magid Dimyan
(74) *Attorney, Agent, or Firm* — Park, Vaughan, Fleming & Dowler LLP; Laxman Sahasrabuddhe

(57) ABSTRACT

One embodiment of the present invention relates to a system that calibrates a photolithography process model. During operation, the system receives a process model which models a photolithography process. The system further receives measured critical dimension (CD) values for a first set of features that were printed by applying the photolithography process to a layout. The system then calibrates the process model using the measured CD values so that CD values predicted by the process model substantially match the measured CD values, and depth of focus (DOF) values predicted by the process model for a second set of features are substantially maximized.

16 Claims, 5 Drawing Sheets

METHOD AND APPARATUS FOR CALIBRATING A PHOTOLITHOGRAPHY PROCESS MODEL BY USING A PROCESS WINDOW PARAMETER

BACKGROUND

1. Field

The present invention generally relates to semiconductor design and manufacturing. More specifically, the present invention relates to a method and a system for accurately calibrating a photolithography process model based at on a process window parameter.

2. Related Art

Semiconductor manufacturing technologies typically include a number of processes which involve complex physical and chemical interactions. Since it is almost impossible to find exact formulae to predict the behavior of these complex interactions, developers typically use process models which are fitted to empirical data to predict the behavior of these processes. A semi-empirical process model can be used in a number of applications during the design of a semiconductor chip.

For example, in a technique which is referred to as "Optical Proximity Correction" (OPC), a photolithography model is used to make corrections to a semiconductor chip layout (chip layout) to compensate for undesirable optical and resist effects of a photolithography process. Hence, a photolithography model typically also includes an aerial image model which models aerial image formation, and a resist model which models resist image formation.

During a photolithography process, the optical exposure system and the wafer surface are configured so that an in-focus aerial image of the layout can be formed on the surface of the wafer. However, an aerial image does not always form under ideal in-focus conditions. For example, as a result of topography variations across the wafer, aerial images of some layout features may form some distance away from the in-focus condition, which is referred to as a "defocus" condition. The range/span of defocus around an in-focus condition which does not cause the manufacturing results to go out of the design specifications is often referred to as a "process window."

An accurate photolithography model should provide an accurate aerial image model which can correctly model the defocus conditions and process model for different layout features, in particular at advanced technology nodes (e.g., 32 nm or below). At the advanced technology nodes, critical dimension (CD) control requirement becomes significantly tighter. For example, at such advanced technology nodes, Across-Chip Linewidth Variation (ACLV) is required to be less than 4 nm, which significantly reduces the process window.

However, because of the difficulty in collecting process window data, conventional photolithography modeling techniques typically only use nominal process condition data which is collected under a single focus condition. Unfortunately, a photolithography model calibrated only using nominal process conditions cannot predict the correct defocus and/or image depth values. Moreover, a calibrated lithography model based only on nominal data cannot be separated into an aerial image model which describes the optical effects, and a resist model which describes the resist effects. However, such separation is necessary for source map optimization (SMO) applications. On the other hand, existing photolithography models which are calibrated using various defocus data are often degraded by significant metrology noise in the defocus data. These models still cannot predict correct process windows, because the model-fitting parameters are affected by the noisy defocus data.

Hence, what is needed is a technique for accurately calibrating a photolithography model without the above-described problems.

SUMMARY

One embodiment of the present invention relates to a system that calibrates a photolithography process model. During operation, the system receives a process model which models a photolithography process. The system further receives measured critical dimension (CD) values for a first set of features that were printed by applying the photolithography process to a layout. The system then calibrates the process model using the measured CD values so that the CD values predicted by the process model substantially match the measured CD values, and the depth of focus (DOF) values predicted by the process model for a second set of features are substantially maximized.

In some embodiments, the system calibrates the process model by computing predicted CD values for the first set of features and predicted DOF values for the second set of features by using the process model.

In some embodiments, the system constructs a cost function based at least on the measured CD values, the predicted CD values, and the predicted DOF values. The system then tunes one or more model parameters in the process model to substantially optimize the cost function.

In some embodiments, the system constructs the cost function by computing residues between the measured CD values and the predicted CD values and subsequently establishing a first objective to minimize the residues. The system further establishes a second objective to maximize the predicted DOF values.

In some embodiments, the system further assigns weights to the first objective and the second objective, respectively.

In some embodiments, the system computes the DOF value for a feature by first using the process model to predict CD values for the feature under multiple defocus conditions. The system then generates a DOF value based on the predicted CD values under the multiple defocus conditions.

In some embodiments, the system generates the DOF value by identifying a set of boundary defocus conditions under which the predicted CD values are within a predetermined tolerance.

In some embodiments, the process model includes an optical process model which models the optical system of the photolithography process, and a resist process model which models resist behavior. Note that the one or more model parameters which are fitted include parameters associated with the optical system and the resist.

In some embodiments, the one or more model parameters include one or more of: an image distance parameter which corresponds to the location of an imaging plane where an aerial image is formed; a threshold parameter which models the resist behavior; and a dose parameter which represents exposure of the illumination source.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Integrated Circuit Design Flow

Figure 1:
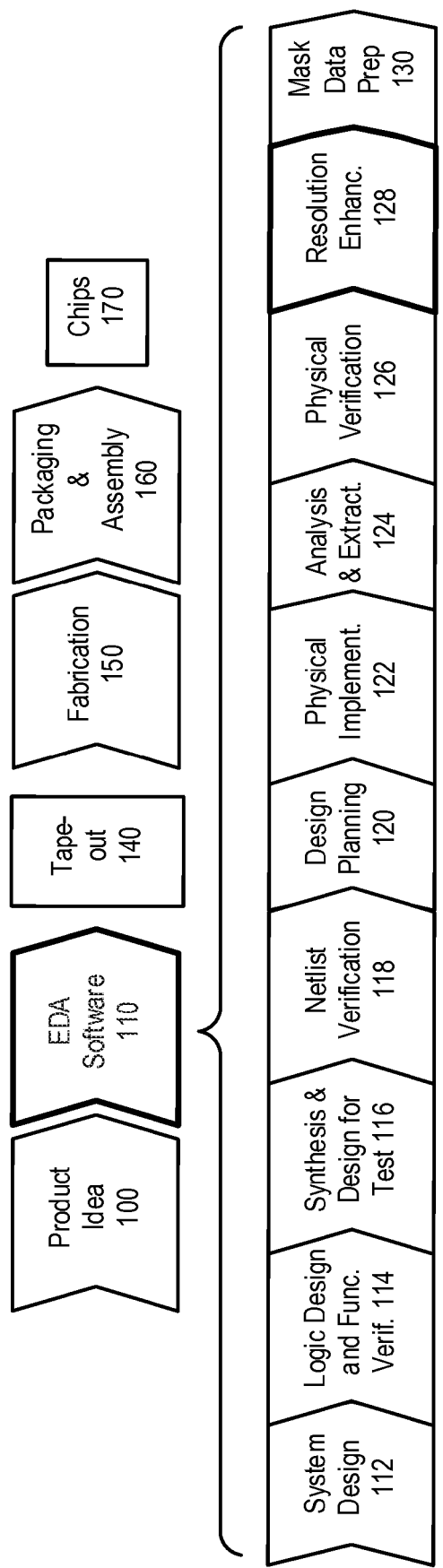
FIG. 1 illustrates various steps in the design and fabrication of an integrated circuit in accordance with an embodiment of the present invention.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include the MODEL ARCHITECT®, SABER®, SYSTEM STUDIO®, and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include the VCS®, VERA®, DESIGNWARE®, MAGELLAN®, FORMALITY®, ESP® and LEDA® products.

Synthesis and design (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include the DESIGN COMPILER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include the FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include the ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include the ASTRORAIL®, PRIMERAIL®, PRIMETIME®, HSPICE®, HSIM®, NANOTIME®, NANOSIM® and STAR-RCXT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement (stage 128): This stage involves geometric manipulations of the layout to improve manufacturability of the design. Exemplary EDA software products from SYNOPSYS, INC. that can be used at this stage include the PROTEUS®, PROTEUS®AF, and PSMGED® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps. Specifically, one embodiment of the present invention can be used during the resolution enhancement step 128.

Terminology

Throughout the specification, the terms "photolithography" and "lithography" are used interchangeably. Also, the terms "pattern" and "feature" are used interchangeably.

Lithography Model Calibration

During a lithography process, a process window may be associated with a number of process conditions, for example, a defocus condition, or an exposure (dose) condition. Generally, an optical exposure system can operate over a range of focus variation called "usable depth of focus" (UDOF), which is the amount of defocus variation that can be tolerated while maintaining an acceptable lithographic quality. UDOF is typically a function of both wavelength and numerical aperture (NA). However, as the wavelength continues to decrease and NA continues to increase, UDOF correspondingly decreases, making the lithography process more sensitive to the defocus-related process window.

Note that the accuracy of the lithography model can limit both the effectiveness of corrected mask patterns and the correctness of post-OPC design layout verification. To generate an accurate lithography model, a fitting process is often performed, which is often referred to as "lithography model calibration." One objective of lithography model calibration is to minimize the difference (or "the residue") between model-generated CD values for a set of layout patterns (or "model-predicted CDs") and corresponding measured CD values on a set of test patterns (or "measured CDs").

A lithography process typically includes a photoresist exposure step using a mask, which forms an aerial image within a photoresist layer on the wafer surface. The photoresist exposure step is followed by a photoresist development step which transfers the mask patterns onto the photoresist layer. In the discussion below, we refer to the CD values measured from a resist profile on the wafer immediately after the photoresist development step as "measured CDs."

Figure 2:
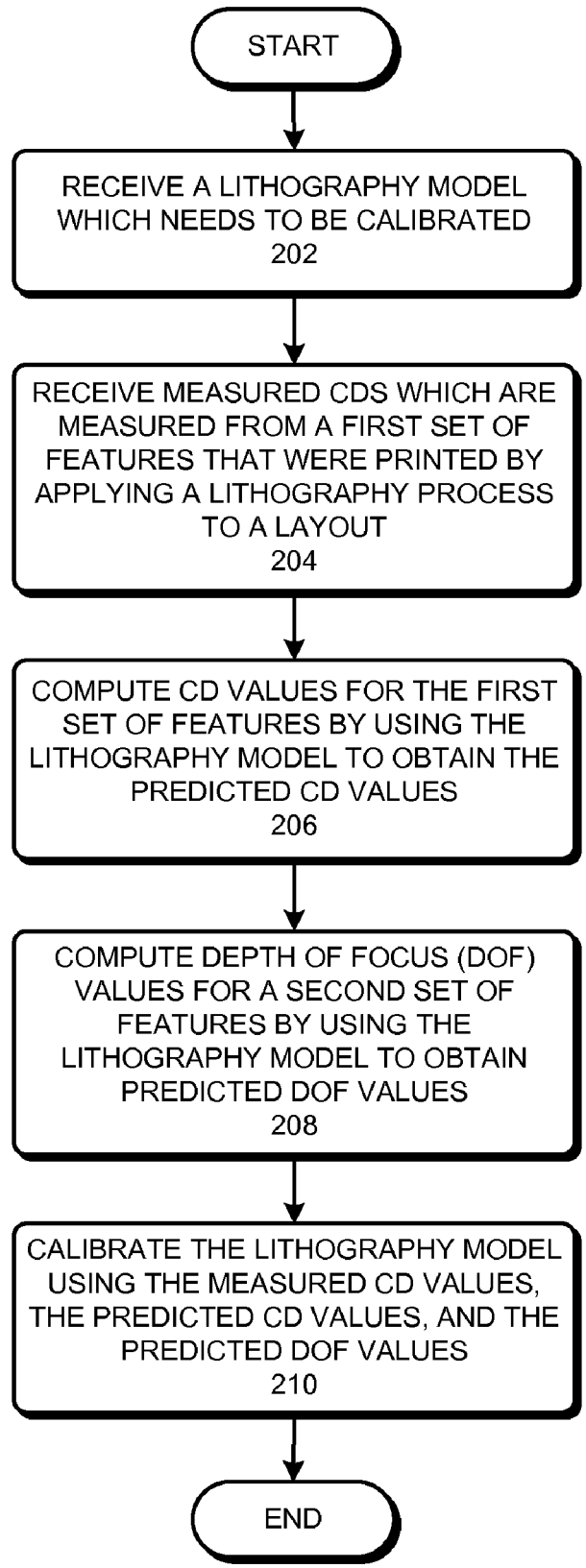
FIG. 2 presents a flowchart illustrating a process for calibrating a lithography model in accordance with an embodiment of the present invention.

FIG. 2 presents a flowchart illustrating a process for calibrating a lithography model in accordance with an embodiment of the present invention. During operation, the system receives a lithography model which needs to be calibrated (step 202). The lithography model can further include an optical process component which models the aerial image formation, and a resist process component which models the photoresist development process. Furthermore, the optical process component includes a set of model-fitting parameters. For example, these model-fitting parameters can include, but are not limited to, a focal length of the lens system, a distance between the lens and the wafer surface, and an image depth which corresponds to the vertical position of the imaging plane within the resist layer where the aerial image is formed. The resist process component also includes a set of model-fitting parameters, such as a threshold of the photoresist. The output of the lithography model represents the data obtained during the after-photoresist development inspection (ADI) step. Hence, the lithography model is often referred to as an ADI model.

Next, the system receives measured CDs which are measured from a first set of features that were printed by applying a lithography process to a layout (step 204). In one embodiment, the first set of features are resist features which are formed in the photoresist layer after the photoresist development step. Note that the lithography model is to be fitted to the lithography process which creates the first set of features.

The system additionally computes CD values for the first set of features by using the lithography model to obtain the predicted CD values for the first set of features (step 206). Note that in this step the term "lithography model" is defined broadly to represent the lithography model at different stages of the model-calibration process. More specifically, the lithography model can refer to the initially uncalibrated model, or it can refer to the lithography model during the calibration process. Because the model parameters may change, for example, through model fitting, during the calibration process, step 206 may generate different predicted CD values on the same set of features during the course of the model calibration.

The system also computes depth of focus (DOF) values for a second set of features by using the lithography model to obtain predicted DOF values (step 208). Note that the second set of features may be layout features.

In the scope of the present invention, a DOF is a type of process window parameter which is associated with defocus conditions and CD value variations under defocus conditions. In one embodiment, DOF is a feature-dependent parameter. More specifically, a DOF value is computed for a feature from which CD values are extracted, and indicates a range of defocus within which the CD value variations for the feature are within a predetermined lithography tolerance. A greater DOF value is generally preferable because it indicates that the CD variations are less sensitive to defocus conditions and allows for the design of a lithography process with a tighter process margin.

Similar to predicting the CD values in step 206, the lithography model in step 208 can refer to the initially uncalibrated model, or it can refer to the lithography model at different stages during the calibration process. Because the model parameters may change during the calibration process, step 208 may generate different predicted DOF values on the same set of features during the course of the model calibration.

Note that the first set of features and the second set of features can be the same set of features or different sets of features. If the first set of features and the second set of features are not the same set of features, there can still be one or more common features between the two sets of features. In one embodiment, computing DOF values for the second set of features involves computing one DOF value for each of the second set of features by using the lithography model.

The system then calibrates the lithography model using the measured CD values and the predicted CD values for the first set of features, and the predicted DOF values for the second set of features (step 210).

Figure 3:
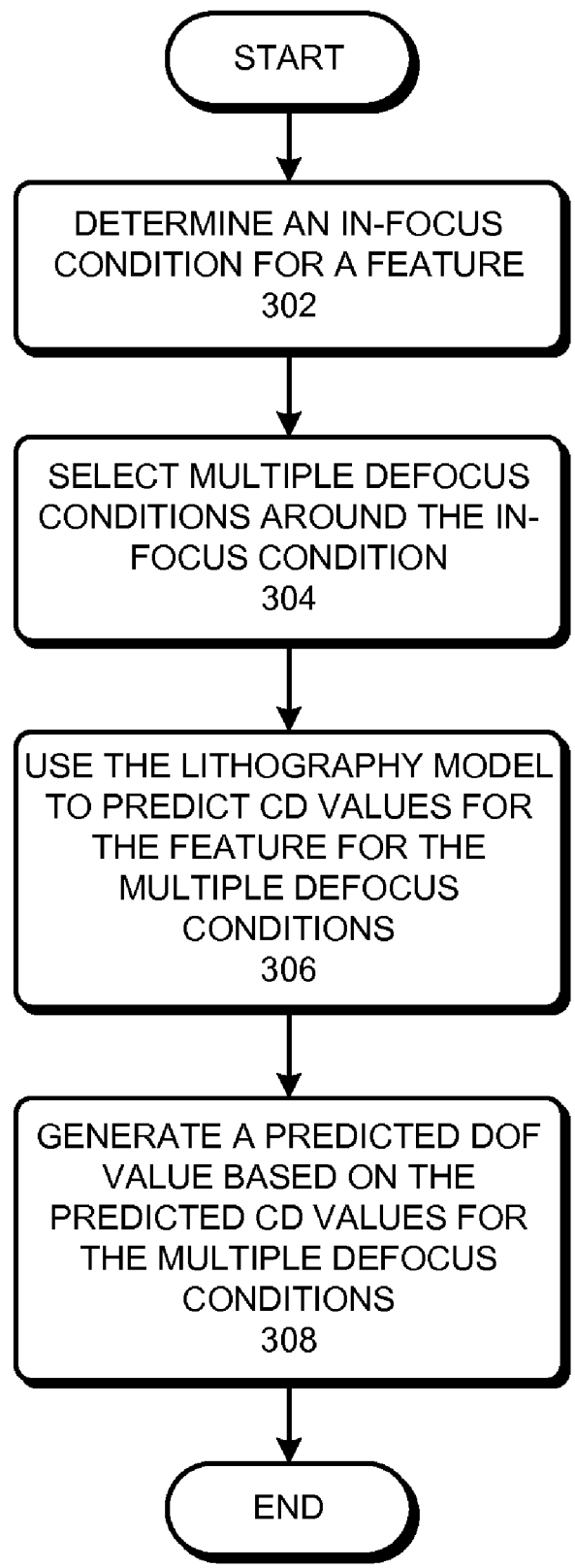
FIG. 3 presents a flowchart illustrating a process for computing a DOF value for a feature in accordance with an embodiment of the present invention.

FIG. 3 presents a flowchart illustrating a process for computing a DOF value for a feature in accordance with an embodiment of the present invention. The system first determines an in-focus condition for the feature (step 302). The system may obtain the in-focus condition from the design specifications. Alternatively, if the feature is a line feature, the system may compute the in-focus condition by searching for a local minimum or maximum of the predicted CD values while perturbing the focus condition in the vicinity of the in-focus condition from the design specifications.

Next, the system selects multiple defocus conditions around the in-focus condition (step 304). In one embodiment, the multiple defocus conditions are chosen from both above and below the in-focus condition. The system then uses the lithography model to predict CD values for the feature for the multiple defocus conditions (step 306). The system subsequently generates a predicted DOF value based on the predicted CD values for the multiple defocus conditions (step 308). In some embodiments, generating the predicted DOF value based on the predicted CD values for the multiple defocus conditions involves identifying a set of boundary defocus conditions for which the predicted CD values are within a predetermined tolerance. For example, the system can use the distance between a maximum defocus condition and a minimum defocus condition to represent the predicted DOF value.

Figure 4:
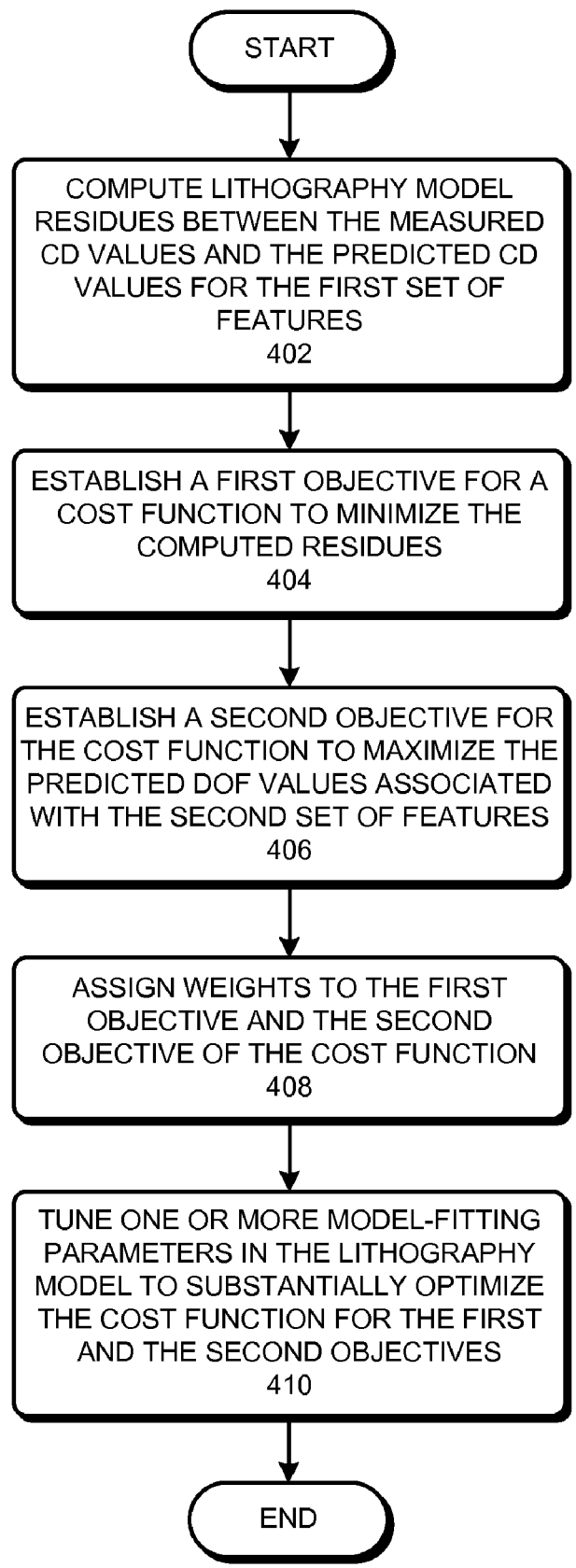
FIG. 4 presents a flowchart illustrating a process for calibrating the lithography model using the measured CD values, the predicted CD values, and the predicted DOF values in accordance with an embodiment of the present invention.

FIG. 4 presents a flowchart illustrating a process for calibrating the lithography model using the measured CD values, the predicted CD values, and the predicted DOF values in accordance with an embodiment of the present invention. Note that the process illustrated in FIG. 4 provides a more detailed embodiment of step 210 in FIG. 2.

During operation, the system computes lithography model residues (or "residues") between the measured CD values and the predicted CD values for the first set of features (step 402). In one embodiment, the residues may be defined as the measured CD values minus the predicted CD values at corresponding locations on a feature in the first set of features.

The system then establishes a first objective for a cost function to minimize the computed residues, so that the predicted CD values substantially match the corresponding measured CD values (step 404). In one embodiment, the residues associated with the first objective include at least one residue value obtained from a single feature in the first set of features. For example, multiple residues may be obtained from multiple locations on a single feature. Note that the first set of features can include only one feature. In one embodiment, this single feature is an anchor gauge pattern. In another embodiment, the residues associated with the first objective include two or more residues obtained from two or more features in the first set of features. Note that a calibrated model will become more accurate when more residues are included for the model calibration, but the calibrated model will also require more computational resources.

The system further establishes a second objective for the same cost function to maximize the predicted DOF values associated with the second set of features (step 406). In one embodiment, the predicted DOF values associated with the second objective include at least one predicted DOF value obtained from a single feature in the second set of features. For example, one or multiple predicted DOF values may be obtained from multiple locations on a single feature. Note that the second set of features can include only one feature. In one embodiment, this single feature is an anchor gauge pattern. In another embodiment, the predicted DOF values associated with the second objective include two or more predicted DOF values obtained from two or more features in the second set of features. Note that a calibrated model will become more accurate when more predicted DOF values are included for the model calibration, but the calibrated model will also require more computational resources.

Next, the system assigns weights to the first objective and the second objective of the cost function (step 408). In some embodiments, the weights for different objectives can be adjusted at each iteration of the calibration process. For example, if the residues in the first objective have become sufficiently minimized while the predicted DOF values in the second objective are still not sufficiently maximized, the system can adjust the weights so that the second objective gets a higher weight than the first objective. In one embodiment, all objectives receive equal weights during the calibration process. In this embodiment, step 408 becomes an optional step.

The system then tunes one or more model-fitting parameters in the lithography model to substantially optimize the cost function for the first and the second objectives (step 410). For example, the system can tune an image depth parameter which corresponds to the vertical position of the imaging plane within a resist layer where the aerial image is formed. The system can also tune other optical process parameters such as focal length of the lens system and a distance between the lens and the wafer surface. Other model-fitting parameters which can be tuned for cost function optimization can include, but are not limited to the threshold of the resist and the dose of the illuminations.

Note that the process which includes steps 206, 208, and 210, wherein step 210 further includes steps 402-410, can be repeated iteratively during the calibration process to optimize the cost function. When both objectives of the cost functions are sufficiently achieved, the cost function is sufficiently optimized and the calibration process is complete. The calibration process generates a more accurate lithography model under process window variations.

As mentioned above, the lithography model describes both an aerial image component and a resist component. By including the process window parameter DOF in the cost function, the final calibrated lithography model provides more accurate aerial image and resist components compared to a lithography model calibrated based only on the CD value residues. As a result, it is possible to separate the aerial image component from the resist component, and subsequently use these two components of the lithography model independently for a number of applications.

For example, in the source map optimization (SMO) applications, the resist process parameters, such as the resist type, may be fixed, while illumination conditions in the optical component are varied. Another benefit of separating the aerial image component and the resist component is the facilitation of independent and efficient resist modeling. More specifically, after separating the two lithography model components, the optical process parameters which include illumination can be fixed, while the resist process parameters, such as threshold, can be fitted for different resist types during the resist modeling. Subsequently, the calibrated resist model can then be used to couple with different illuminations so that the SMO applications can receive real-time OPC model performance feedback.

The lithography model calibration technique of the present invention is beneficial for process window OPC modeling applications. Note that, when using conventional lithography models for process window OPC modeling applications, a constant value of model threshold (representing activation energy threshold of resist) which represents dose variations for different exposure focus or exposure dose models cannot be achieved. On the other hand, when a lithography model calibrated using the present technique is used for such applications, a constant value of model threshold (representing activation energy threshold of resist) which represents dose variations for different exposure focus or exposure dose models can be achieved.

Note that, when using a lithography model that was calibrated using the present techniques to extrapolate defocus conditions data, the extrapolation data can match the measured process window data, such as the defocus data commonly represented by a Bossung plot. In some embodiments, the calibrated lithography model can be used to filter or isolate measurement noise present in both nominal and process window measured data prior to using such measured data for further model calibration.

Figure 5:
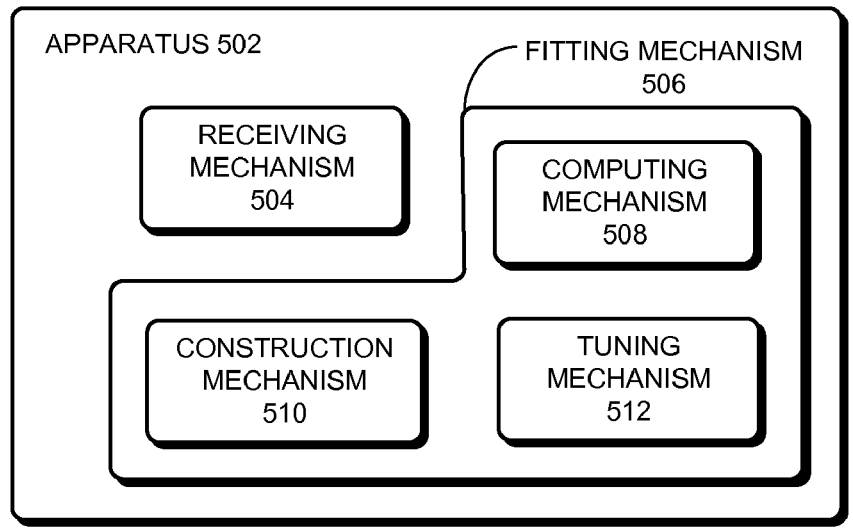
FIG. 5 illustrates an apparatus that calibrates a lithography model in accordance with an embodiment of the present invention.

FIG. 5 illustrates an apparatus 502 that calibrates a lithography model in accordance with an embodiment of the present invention.

Apparatus 502 can comprise mechanisms which communicate with one another via a wired or wireless communication channel. Specifically, apparatus 502 can comprise a receiving mechanism 504 and a fitting mechanism 506. Moreover, fitting mechanism 506 can further include a computing mechanism 508, a construction mechanism 510, and a tuning mechanism 512. Each of the above mechanisms may be realized using one or more integrated circuits or as a module of a general purpose processor. Apparatus 502 can be part of a computer system.

In some embodiments, receiving mechanism 504 may be configured to receive a process model which models a lithography process and measured CD values for a first set of features that were printed by applying the lithography process to a layout; computing mechanism 508 may be configured to compute CD values for the first set of features by using the process model to obtain the predicted CD values and compute a DOF value for each of the second set of features by using the process model to obtain the predicted DOF values; construction mechanism 510 may be configured to construct a cost function based at least on the measured CD values, the predicted CD values, and the predicted DOF values; and tuning mechanism 512 may be configured to tune one or more model parameters in the process model to substantially optimize the cost function.

Figure 6:
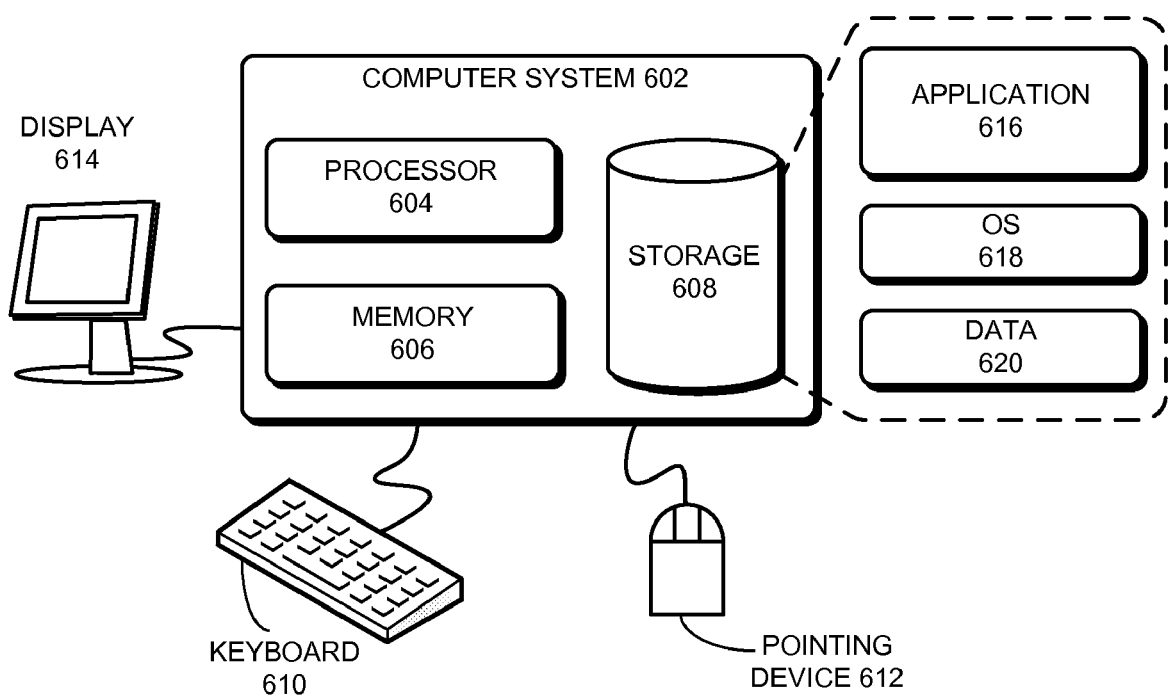
FIG. 6 illustrates a computer system in accordance with an embodiment of the present invention.

FIG. 6 illustrates a computer system 602 in accordance with an embodiment of the present invention.

A computer system can generally be any system that can perform computations. Specifically, a computer system can be a microprocessor, a network processor, a portable computing device, a personal organizer, a device controller, or a computational engine within an appliance, or any other computing system now known or later developed. Computer system 602 comprises processor 604, memory 606, and storage 608. Computer system 602 can be coupled with display 614, keyboard 610, and pointing device 612. Storage 608 can generally be any device that can store data. Specifically, a storage device can be a magnetic, an optical, or a magneto-optical storage device, or it can be based on flash memory and/or battery-backed up memory. Storage 608 can store application 616, operating system 618, and data 620.

Application 616 can include instructions that when executed by computer 602 cause computer 602 to perform one or more processes described in this disclosure. Data 620 can include any data that is required as input or that is generated as output by the methods and/or processes described in this disclosure.

CONCLUSION

While the present invention is described in the context of using a DOF-based process window parameter for lithography model calibration, other types of process window parameters may be used to add additional objectives in the cost function during lithography model calibration.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for calibrating a photolithography process model, the method comprising:
   receiving a process model which models a photolithography process;
   receiving measured critical dimension (CD) values for a first set of features that were printed by applying the photolithography process to a layout; and
   calibrating, by computer, the process model by:
      constructing a cost function, which involves:
         computing residues between the measured CD values and CD values predicted by the process model;
         establishing a first objective to minimize the residues; and
         establishing a second objective to maximize depth of focus (DOF) values predicted by the process model for a second set of features; and
      tuning one or more model parameters in the process model to optimize the cost function.

2. The method of claim 1,
   wherein the predicted CD values are obtained by computing CD values for the first set of features using the process model; and
   wherein the predicted DOF values are obtained by computing a DOF value for each of the second set of features using the process model.

3. The method of claim 2, wherein computing the DOF value for a feature involves:
   using the process model to predict CD values for the feature under multiple defocus conditions; and
   generating a DOF value based on the predicted CD values under the multiple defocus conditions.

4. The method of claim 3, wherein generating the DOF value based on the predicted CD values for the multiple defocus conditions involves identifying a set of boundary defocus conditions under which the predicted CD values are within a predetermined tolerance.

5. The method of claim 1, wherein constructing the cost function further comprises assigning weights to the first objective and the second objective, respectively.

6. The method of claim 1,
   wherein the process model includes an optical process model which models the optical system of the photolithography process, and a resist process model which models resist behavior; and
   wherein the one or more model parameters include parameters associated with the optical system and the resist.

7. The method of claim 6, wherein the one or more model parameters include one or more of:
   an image distance parameter which corresponds to the location of an imaging plane where an aerial image is formed;
   a threshold parameter which models the resist behavior; and
   a dose parameter which represents exposure of the illumination source.

8. A non-transitory computer-readable storage medium storing instructions that when executed by a computer cause the computer to perform a method for calibrating a photolithography process model, the method comprising:
   receiving a process model which models a photolithography process;
   receiving measured critical dimension (CD) values for a first set of features that were printed by applying the photolithography process to a layout; and calibrating the process model by:
  constructing a cost function, which involves:
    computing residues between the measured CD values and CD values predicted by the process model;
    establishing a first objective to minimize the residues; and
    establishing a second objective to maximize depth of focus (DOF) values predicted by the process model for a second set of features; and
  tuning one or more model parameters in the process model to optimize the cost function.

9. The non-transitory computer-readable storage medium of claim 8,
  wherein the predicted CD values are obtained by computing CD values for the first set of features by using the process model; and
  wherein the predicted DOF values are obtained by computing a DOF value for each of the second set of features by using the process model.

10. The non-transitory computer-readable storage medium of claim 9, wherein computing the DOF value for a feature involves:
  using the process model to predict CD values for the feature under multiple defocus conditions; and
  generating a DOF value based on the predicted CD values under the multiple defocus conditions.

11. The non-transitory computer-readable storage medium of claim 10, wherein generating the DOF value based on the predicted CD values for the multiple defocus conditions involves identifying a set of boundary defocus conditions under which the predicted CD values are within a predetermined tolerance.

12. The non-transitory computer-readable storage medium of claim 8, wherein constructing the cost function further comprises assigning weights to the first objective and the second objective, respectively.

13. The non-transitory computer-readable storage medium of claim 8,
  wherein the process model includes an optical process model which models the optical system of the photolithography process, and a resist process model which models resist behavior; and
  wherein the one or more model parameters include parameters associated with the optical system and the resist.

14. The non-transitory computer-readable storage medium of claim 13, wherein the one or more model parameters include one or more of:
  an image distance parameter which corresponds to the location of an imaging plane where an aerial image is formed;
  a threshold parameter which models the resist behavior; and
  a dose parameter which represents exposure of the illumination source.

15. An apparatus that calibrates a photolithography process model, comprising:
  a receiving mechanism configured to receive a process model which models a photolithography process;
  wherein the receiving mechanism is further configured to receive measured critical dimension (CD) values for a first set of features that were printed by applying the photolithography process to a layout; and
  a calibration mechanism configured to calibrate the process model by:
    constructing a cost function, which involves:
      computing residues between the measured CD values and CD values predicted by the process model;
      establishing a first objective to minimize the residues; and
      establishing a second objective to maximize depth of focus (DOF) values predicted by the process model for a second set of features; and
    tuning one or more model parameters in the process model to optimize the cost function.

16. The apparatus of claim 15, wherein the calibration mechanism further includes:
  a computing mechanism configured to compute CD values for the first set of features by using the process model to obtain the predicted CD values; and
  wherein the computing mechanism is further configured to compute a DOF value for each of the second set of features by using the process model to obtain the predicted DOF values.

* * * * *